(12) United States Patent
Shiratani

(10) Patent No.: US 7,779,848 B2
(45) Date of Patent: Aug. 24, 2010

(54) APPARATUS AND METHOD FOR CLEANING SEMICONDUCTOR WAFER

(75) Inventor: Masafumi Shiratani, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 900 days.

(21) Appl. No.: 11/581,461

(22) Filed: Oct. 17, 2006

(65) Prior Publication Data
US 2007/0084482 A1  Apr. 19, 2007

(30) Foreign Application Priority Data
Oct. 18, 2005  (JP) .............................. 2005-303434

(51) Int. Cl.
*B08B 3/00* (2006.01)
(52) U.S. Cl. .................. 134/137; 134/183; 134/186
(58) Field of Classification Search ................ 134/137, 134/183, 186
See application file for complete search history.

(56) References Cited

U.S. PATENT DOCUMENTS

2004/0050491 A1* 3/2004 Miya et al. ............. 156/345.11

FOREIGN PATENT DOCUMENTS

JP  2001-176831  6/2001
JP  2002-246364  8/2002

OTHER PUBLICATIONS

Hayashi et al., JP 2001-176831, Jun. 2001, English machine translation.*

* cited by examiner

*Primary Examiner*—Michael Barr
*Assistant Examiner*—Jason Y Ko
(74) *Attorney, Agent, or Firm*—Young & Thompson

(57) ABSTRACT

Method and apparatus for precisely removing dusts from a side edge of a wafer, improving a production yield of wafers, and reducing a manufacturing cost for semiconductor devices. The apparatus includes: a retaining table having a circular top plan view, capable of retaining the wafer disposed on the top surface, and being rotated in the wafer cleaning; a feeding unit for supplying a cleaning solution to a top surface of the wafer; a cup member for recovering the cleaning solution supplied to the wafer, the cup member surrounding a radially outer circumference and a bottom of the retaining table; and a guard member disposed inside the cup member so as to be spaced apart from the retaining table, which surrounds the radially outer circumference of the retaining table.

6 Claims, 7 Drawing Sheets

APPARATUS AND METHOD FOR CLEANING SEMICONDUCTOR WAFER

This application is based on Japanese patent application No. 2005-303,434, the content of which is incorporated hereinto by reference.

BACKGROUND

1. Field of the Invention

The present invention relates to an apparatus and method for cleaning a semiconductor wafer with a cleaning solution.

2. Related Art

A single-wafer process, which involves cleaning a wafer by dropping a cleaning solution on a surface of the wafer while rotating the wafer, is often employed for a cleaning system in a process for manufacturing a semiconductor device.

A typical cleaning apparatus in such cleaning system, which cleans a wafer by disposing a wafer on a rotating table and dropping a cleaning solution on the wafer from a nozzle, is known in the art (see, for example, Japanese Patent Laid-Open No. 2001-176,831). In such type of cleaning apparatus, as shown in FIG. 7, dusts and/or accumulated materials remained on the surface of the wafer are removed by sweeping these dusts with the cleaning solution spreading via a centrifugal force that is created by the rotation of the wafer. In the cleaning apparatus described in Japanese Patent Laid-Open No. 2001-176,831, a cup member is provided so as to surround a radially outer circumference of the rotating table, and the cleaning solution scattering from the circumference of the wafer toward radial outer directions is collected.

In addition, other type of cleaning apparatus, in which a circumference of a wafer is supported by a plurality of roller, and is provided with a mask under the wafer, is proposed (see, for example, Japanese Patent Laid-Open No. 2002-246,364). In such cleaning apparatus, a gap is provided between the mask and a lower surface of the wafer to have a size of about 0.05 to 1.0 mm, and the cleaning solution is drawn into the gap by utilizing capillary phenomenon.

Nonetheless, since the cleaning solution is separated from the wafer and is scattered in the cleaning apparatus described in Japanese Patent Laid-Open No. 2001-176,831, no cleaning solution is supplied to the side edge of the wafer, such that a sufficient removal of dusts remained on the side surface of the wafer can not be achieved.

In addition, since the cleaning solution is drawn into the gap by utilizing capillary phenomenon in the cleaning apparatus described in Japanese Patent Laid-Open No. 2002-246,364, the cleaning solution cannot be sufficiently circulated across the wafer. More specifically, since a flow rate of the cleaning solution is extremely low, it is difficult to remove dusts on the side edge of the wafer, and thus an efficiency in the cleaning of the side edge of the wafer is extremely deteriorated.

SUMMARY OF THE INVENTION

According to one aspect of the present invention, there is provided an apparatus for cleaning a semiconductor wafer, comprising: a retaining table having a circular top plan view, the retaining table being capable of retaining a wafer disposed on the top surface thereof and being capable of rotating during cleaning the wafer; a supply unit for supplying a cleaning solution to the top surface of the wafer disposed on the retaining table; a cup member for recovering the cleaning solution supplied to the wafer by the supply unit, the cup member surrounding a radially outer circumference and a bottom of the retaining table; and a guard member, being disposed in an inside of the cup member and being spaced apart from the retaining table, the guard member surrounding the radially outer circumference of the retaining table, wherein the retaining table retains the wafer so that the side edge of the retaining table and the side edge of the wafer form a common surface, and wherein the side edges of the wafer and the retaining table and an inner surface of the guard member define a flowing passage, which is capable of being substantially fulfilled with the cleaning solution during the cleaning of the wafer.

In the apparatus for cleaning the semiconductor wafer according to the above-described aspect of the present invention, the cleaning solution is supplied to the top surface of the wafer from the supply unit, while rotating the retaining table together with the wafer in cleaning the wafer. The cleaning solution supplied to the top surface of the wafer is transferred in the top surface of the wafer toward the radially outer circumference by a centrifugal force. Once the cleaning solution reaches the circumference of the wafer, the cleaning solution is transferred through the flowing passage toward the lower direction.

Since the flowing passage is filled with the cleaning solution in such occasion, the cleaning solution steadily flows over the side edge of the wafer. In addition, since the side edges of the wafer and the retaining table form a common surface, a smooth flow of the cleaning solution in vicinity of the wafer in the flowing passage can be achieved, thereby ensuring a sufficient flow velocity in vicinity of the wafer.

While the configuration according to the aspect of the present invention has been described, it is not intended that the present invention is limited thereto, and it can be understood that various configurations may also be equally included in the scope of the present invention. For example, according to another aspect of the present invention, there is provided a method for cleaning a semiconductor wafer, by employing an apparatus for cleaning a semiconductor wafer, the apparatus comprising: a retaining table having a circular top plan view, the retaining table being capable of retaining a wafer disposed on the top surface thereof and being capable of rotating during cleaning the wafer; and a guard member, being disposed spaced apart from the retaining table, the guard member surrounding the radially outer circumference of the retaining table, the method comprising: defining a flowing passage with the side edges of the wafer and the retaining table and an inner surface of the guard member, while retaining the wafer so that the side edge of the retaining table and the side edge of the wafer form a common surface; flowing a cleaning solution by supplying the cleaning solution to a top surface of the wafer while rotating the retaining table together with the wafer, thereby flowing into the flowing passage the cleaning solution, which moves in the top surface of the wafer toward the radially outer circumference, so that the flowing passage is substantially filled with the cleaning solution.

As described above, according to the present invention, the cleaning solution can be flowed around the side edge of the wafer while the sufficient flow rate is assured, so that dusts on the side edge of the wafer can be totally removed. Therefore, the configuration can provide an improved production yield for manufacturing wafers, thereby achieving a reduced production cost for manufacturing the semiconductor devices.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of apparatus for cleaning semiconductor wafers according to the present invention will be described as follows in further detail, in reference to the annexed figures. In all figures, identical numeral is assigned to an element commonly appeared in the figures, and the detailed description thereof will not be presented.

Figure 1:
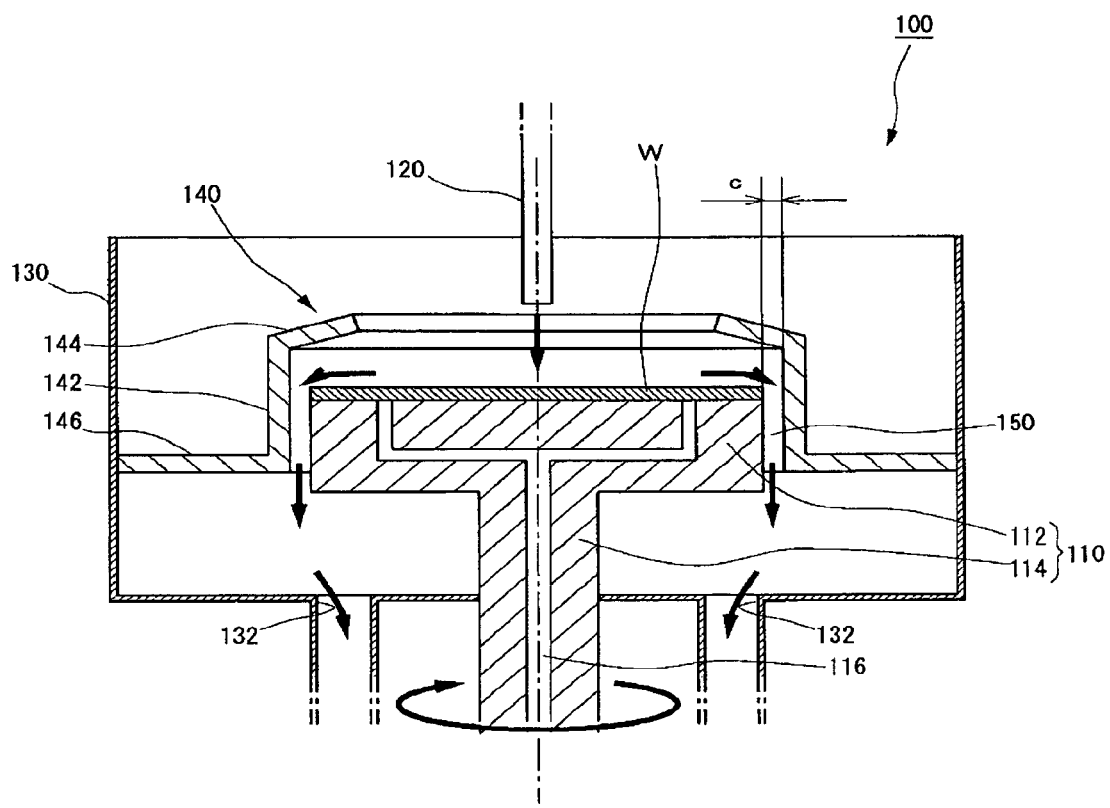
FIG. 1 is a schematic longitudinal sectional view of an apparatus for cleaning a semiconductor wafer, illustrating first embodiment of the present invention.
Figure 2:
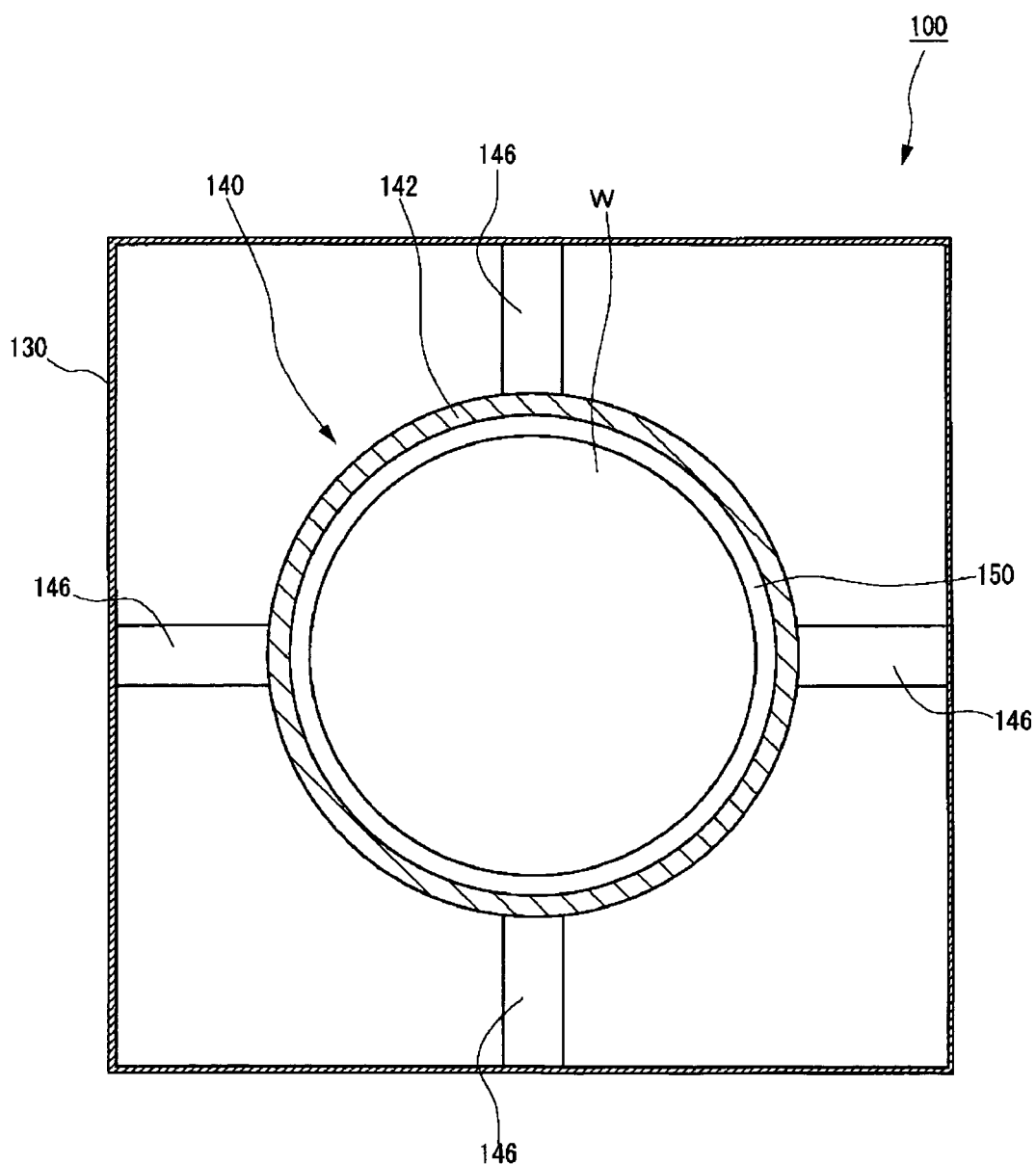
FIG. 2 is a schematic lateral cross-sectional view of the cleaning apparatus.
Figure 3:
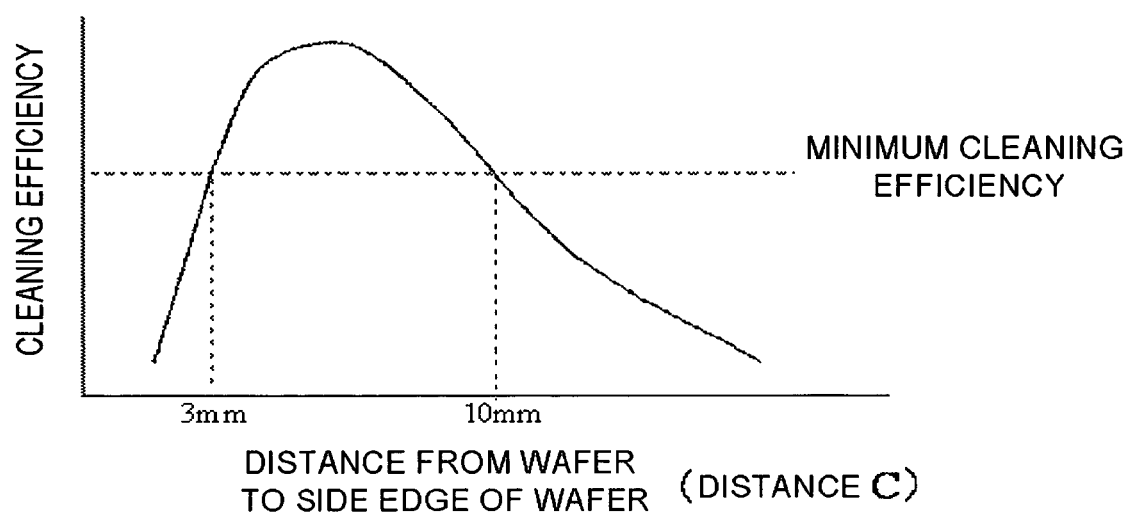
FIG. 3 is a graph, showing a relationship of a cleaning efficiency with the distance from the side edges of the wafer and the retaining table to the inner surface of the guard member.

FIG. 1 to FIG. 3 illustrate an embodiment of the present invention, and more specifically, FIG. 1 is a schematic longitudinal sectional view of a cleaning apparatus of a semiconductor wafer, FIG. 2 is a schematic transverse cross-sectional view of a cleaning apparatus, and FIG. 3 is a graph showing a relationship of a cleaning efficiency with a distance from side edges of a wafer and a retaining table to an inner surface of a guard member.

As shown in FIG. 1, a cleaning apparatus 100 for a semiconductor wafer W includes: a retaining table 110 having a circular top plan view, which is capable of retaining the wafer W disposed on the top surface, and being rotated in the wafer cleaning; a feeding tube 120 for supplying a cleaning solution to a top surface of the wafer W disposed on the retaining table 110;

a cup member 130 for recovering the cleaning solution supplied to the wafer W by the feeding tube 120, the cup member surrounding a radially outer circumference and a bottom of the retaining table 110; and a guard member 140 disposed in an inside of the cup member 130 so as to be spaced apart from the retaining table 110, which surrounds the radially outer circumference of the retaining table 110.

The retaining table 110 comprises a table body 112 formed to have a plan view, which is the same as the plan view of the wafer W, and a drive shaft 114 coupled to a central portion of a lower surface of the table body 112. In the present embodiment, the table body 112 is formed to be flat cylindrical, and the drive shaft 114 is formed to be elongated cylindrical. The drive shaft 114 is coupled to drive mechanism, which is not shown in any of the diagrams.

Further, a suction passage 116 is formed in the inside of the table body 112 and the drive shaft 114. The suction passage 116 vertically extends within the drive shaft 114, and is in communication with the top surface of the table body 112. Having such configuration, the wafer W can be chucked on the table body 112 via a suction by drawing air through the suction passage 116 from the lower portion thereof. As shown in FIG. 1, the retaining table 110 retains the wafer W so that a side edge of the retaining table 110 forms a common surface with a side edge of the wafer.

The feeding tube 120 is disposed above the retaining table 110, and is employed to drop the cleaning solution on the top surface of the wafer. More specifically, the feeding tube 120 vertically extend along central axes of the wafer W and the retaining table 110, so that the cleaning solution is flowed out to the center of wafer W from an outlet of the bottom end thereof.

Further, the cup member 130 is formed to have a rectangular solid geometry having an opened top surface, and has an outlet port 132 for a cleaning solution in the bottom surface. The cleaning solution, which has been supplied from the feeding tube 120 to the top surface of the wafer W, is discharged from the outlet port 132, and is recovered.

The guard member 140 is formed to be substantially cylindrical, and is disposed in the inside of the cup member 130. As shown in FIG. 1, the side edges of the wafer W and the retaining table 110 and the inner surface of the guard member 140 define a flowing passage 150, which is capable of being substantially fulfilled with the cleaning solution during the cleaning of the wafer. More specifically, as shown in FIG. 2, the flowing passage 150 is formed over the circumference direction in the present embodiment.

The guard member 140 comprises a passage defining portion 142, which forms a wall of the flowing passage 150 and extends in vertical direction, and a flange portion 144 extending from the upper end of the passage defining portion 142 in obliquely upward direction inclining toward a radially inward direction. The passage defining portion 142 is formed to be substantially parallel to the side edges of the wafer W and the retaining table 110 in the longitudinal section, and the upper end thereof extends to the above of the wafer W, and the bottom end thereof extends to the above of the bottom end of the retaining table 110. The flange portion 144 extends from the upper end of the passage defining portion 142 to the top view-inside of the circumference of the wafer W and the retaining table 110. Further, the guard member 140 has a support 146 extending from the bottom end of the passage defining portion 142 to the radially outer circumference and having a predetermined width dimension. As shown in FIG. 2, the support 146 is connected to the inner surface of the cup member 130.

A distance "c" from the side edges of the wafer W and the retaining table 110 to the inner surface of the guard member 140 in the flowing passage 150 may be suitably selected so that the inside of the passage be fulfilled with a cleaning solution in the wafer cleaning, and the preferable distance may be within a range of from 3 mm to 10 mm.

In the thus-configured apparatus 100 for cleaning the semiconductor wafer W, on the occasion of the wafer cleaning, the wafer W is rotated together with rotating the retaining table 110 by actuating a drive mechanism (not shown), maintaining the wafer W being chucked to the retain table body 112, while a cleaning solution is supplied to the top surface of the wafer W from the feeding tube 120. The cleaning solution supplied to the top surface of the wafer W is transported to the radially outer circumference of the wafer W by a centrifugal force, While cleaning the top surface of.

Once the cleaning solution reaches to the circumference of the wafer W, the cleaning solution is transported through the flowing passage 150 toward the lower direction. The cleaning solution that has been passed through the flowing passage 150 is collected in the cup member 130, and then is discharged via the outlet port 132.

Since the flowing passage 150 is fulfilled with the cleaning solution in this occasion, the cleaning solution steadily flows around the side edge of the wafer W. Further, since the side edges of the wafer W and the retaining table 110 form a common surface, a smooth flow of the cleaning solution in vicinity of the wafer W in the flowing passage 150 can be achieved, thereby ensuring a sufficient flow velocity in vicinity of the wafer W. Further, portions of the cleaning solution leaped out of the top surface of the wafer W collides with the flange portion 144 of the guard member 140, so that the leaped solution is introduced to the flowing passage 150, without being discharged to the outside of the guard member 140. Having this configuration, a sufficient flow rate of the cleaning solution through the flowing passage 150 is also ensured.

As such, according to the apparatus 100 for cleaning the wafer W of the present embodiment, a cleaning solution can be flowed in vicinity of the side edge of the wafer W under the condition that a sufficient flow velocity is ensured, such that dusts on the side edge of the wafer W can be precisely removed. Therefore, an improved production yield of wafer W can be provided, thereby reducing a manufacturing cost for the semiconductor device.

In the method for cleaning the wafer W in the present embodiment, an apparatus 100 for cleaning a semiconductor wafer is employed to conduct a cleaning of the wafer W, and the apparatus comprises: a retaining table 100 having a circular top plan view, said retaining table being capable of retaining a wafer W disposed on the top surface thereof and being capable of rotating during cleaning the wafer; and a guard member 140 disposed spaced apart from the retaining table 110 and surrounding the radially outer circumference of the retaining table 110. More specifically, the cleaning method includes: defining a flowing passage 150 with the side edges of the wafer W and the retaining table 110 and an inner surface of the guard member 140, while retaining the wafer W so that the side edge of the retaining table 110 and the side edge of the wafer W form a common surface; flowing a cleaning solution by supplying the cleaning solution to a top surface of the wafer W while rotating the retaining table 110 together with the wafer W, thereby flowing into the flowing passage 150 the cleaning solution, which moves in the top surface of the wafer W toward the radially outer circumference, so that the flowing passage 150 is substantially filled with the cleaning solution.

A relationship of a cleaning efficiency with a distance "c" from the side edges of the wafer W and the retaining table 110 to the inner surface of the guard member 140 in such cleaning apparatus 100 is shown in a graph of FIG. 3. As shown in FIG. 3, a peak of cleaning efficiency appears at a predetermined most suitable distance. In manufacturing the semiconductor device, a minimum cleaning efficiency is determined in consideration of a production yield of the semiconductor devices and/or an influence of dusts in the post-manufacturing process, and a distance "c" for satisfying the minimum cleaning efficiency extends across the peak to attain within a predetermined range. It has been confirmed that, when diameters of the wafer W and the retaining table 110 are 200 mm, such distance "c" is within a range of from 3 mm to 10 mm. If a certain distance "c" of about 3 mm is ensured, a mutual interference in relative vertical movements of the guard member 140 and the retaining table 110 can be avoided, thereby preventing an obstacle created by an insufficient dimensional accuracy in the mechanical drive unit in the cleaning apparatus 100. In addition to above, the distance c is tended to be reduced as the diameter of the wafer W is increased to be larger than 200 mm, and the distance c is tended to be increased as the diameter of the wafer W is reduced to be smaller than 200 mm.

Figure 4:
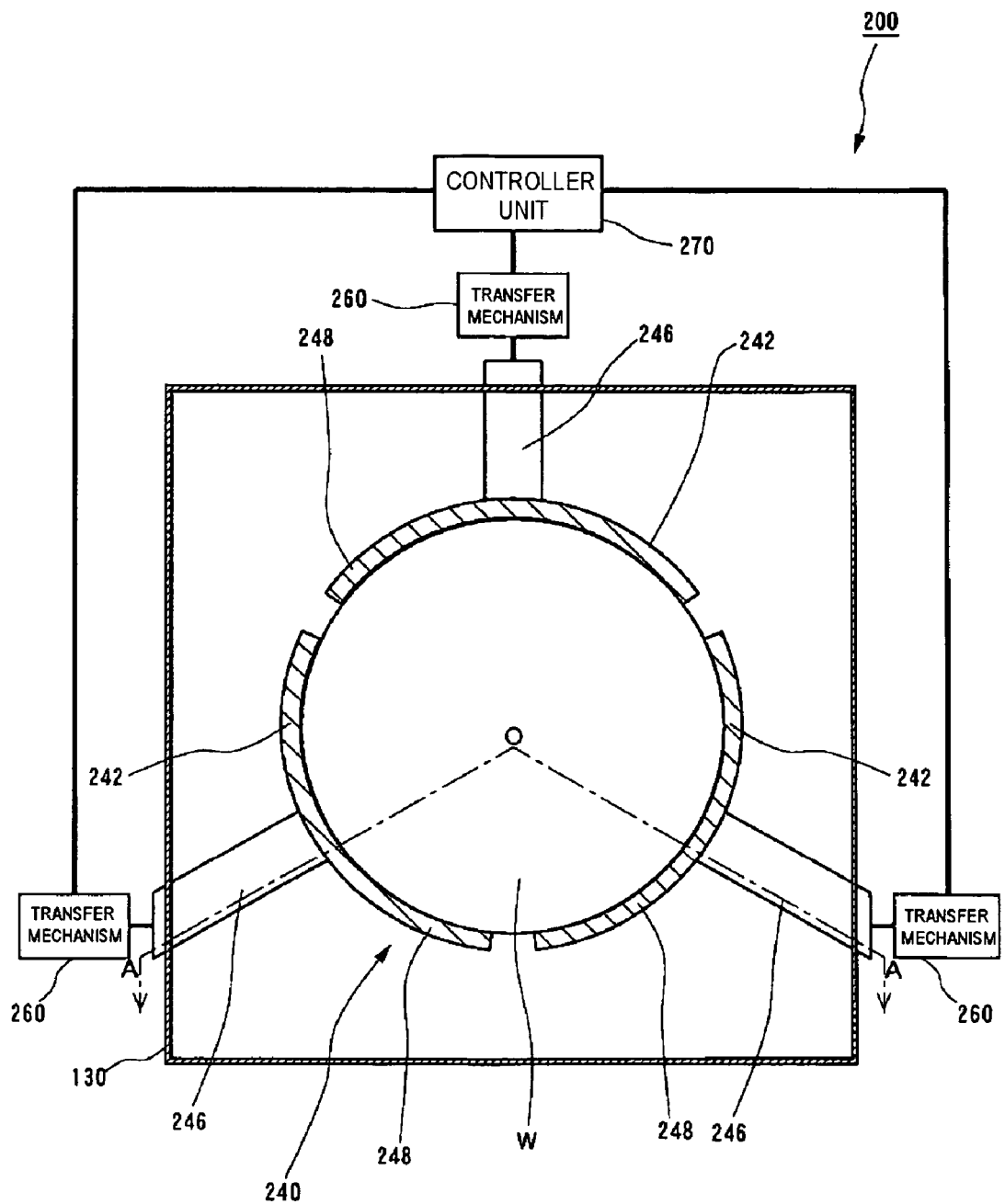
FIG. 4 is a schematic longitudinal sectional view of an apparatus for cleaning a semiconductor wafer, illustrating second embodiment of the present invention.
Figure 5:
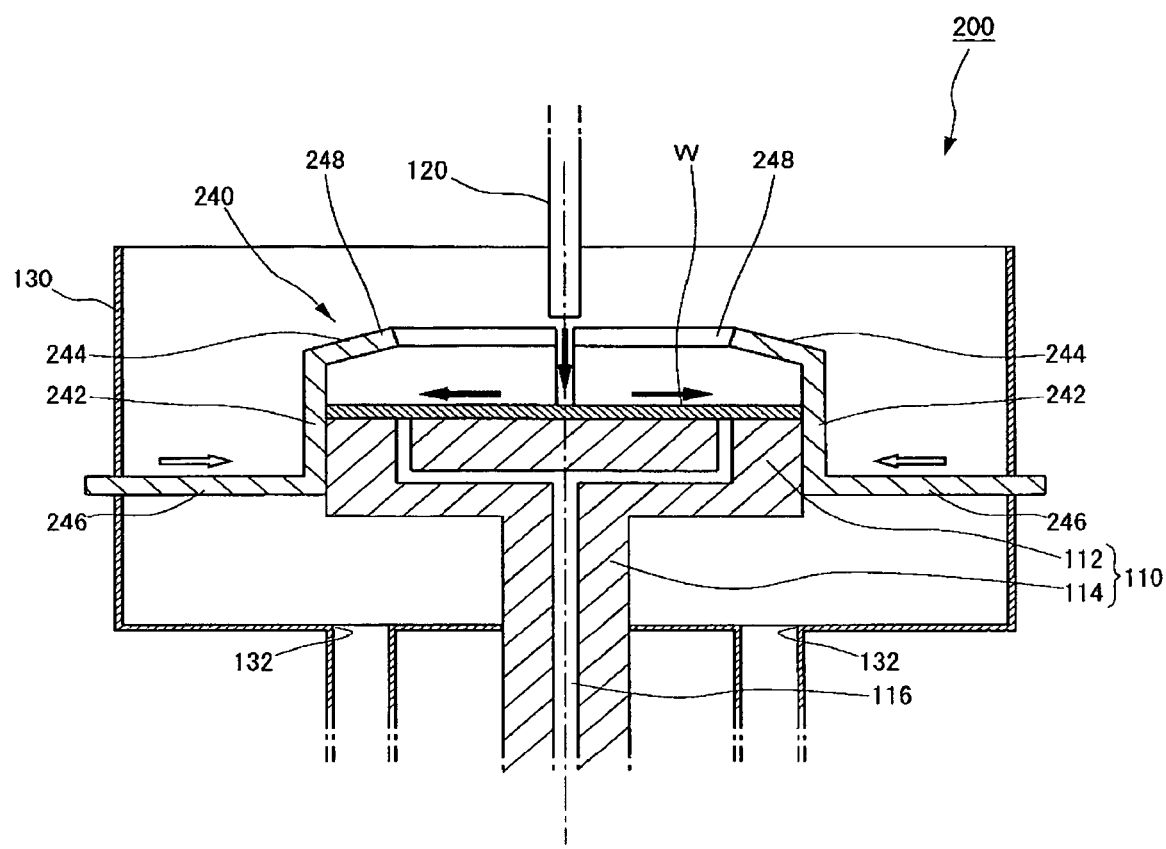
FIG. 5 is a cross-sectional view of the cleaning apparatus shown in FIG. 4 along line A-O-A, illustrating a condition that a flowing passage is closed.
Figure 6:
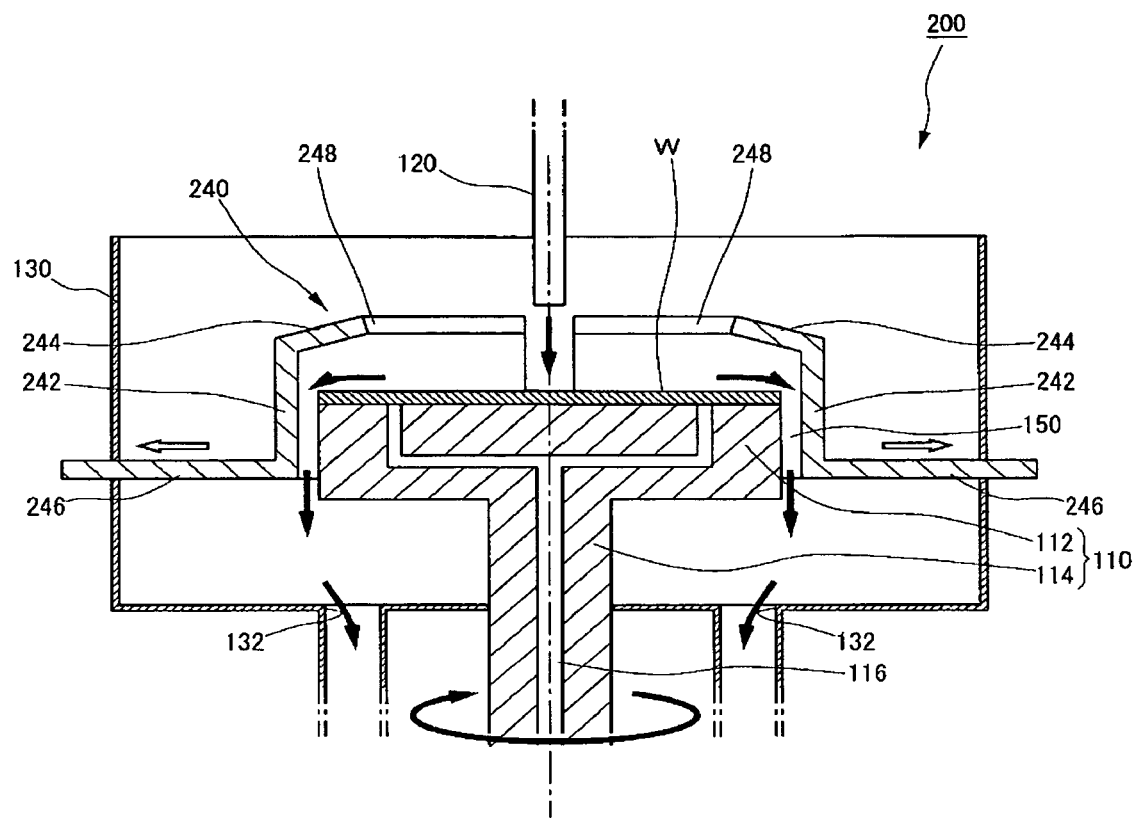
FIG. 6 is a cross-sectional view of the cleaning apparatus shown in FIG. 4 along line A-O-A, illustrating a condition that a flowing passage is opened.
Figure 7:
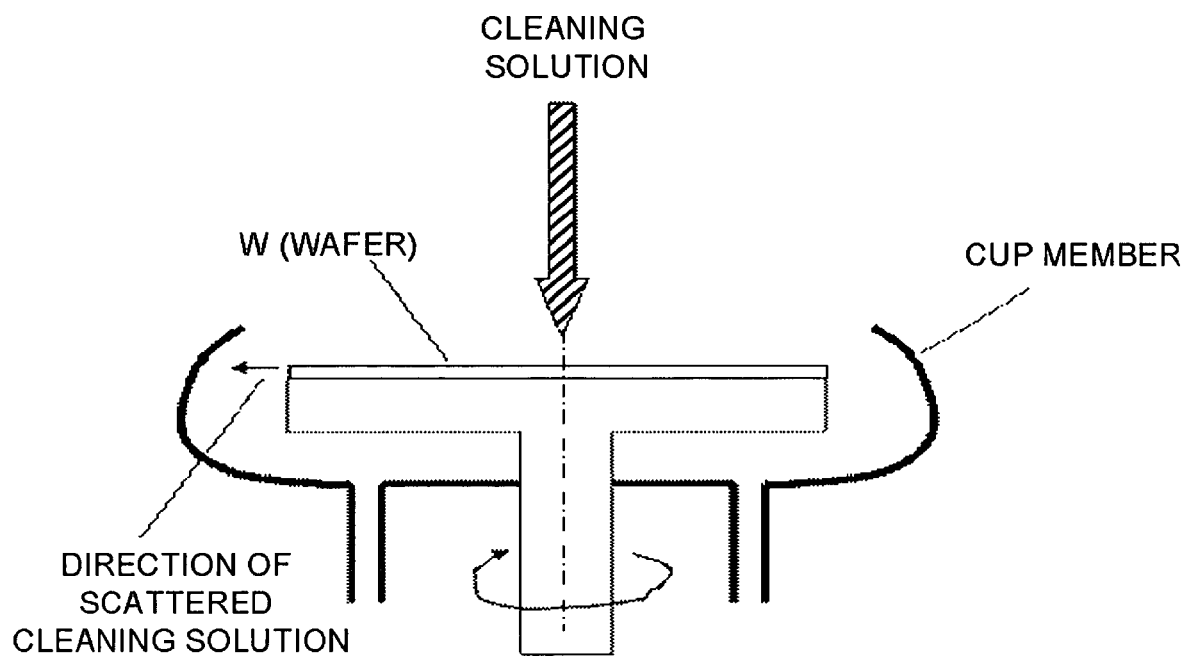
FIG. 7 is a schematic longitudinal sectional view of a conventional cleaning apparatus.

FIG. 4 to FIG. 6 illustrates second embodiment of the present invention, and FIG. 4 is a schematic lateral cross-sectional view of a cleaning apparatus, FIG. 5 is a cross-sectional view of the cleaning apparatus shown in FIG. 4 along line A-O-A, illustrating a condition that a flowing passage is closed, and FIG. 6 is a cross-sectional view of the cleaning apparatus shown in FIG. 4 along line A-O-A, illustrating a condition that a flowing passage is opened. The cleaning apparatus of second embodiment has a structural difference from the cleaning apparatus of first embodiment in the configuration of the guard member.

As shown in FIG. 4, in a cleaning apparatus 200, a guard member 240 is composed of a plurality of segment members 248. More specifically, the guard member 240 is composed of three segment members 248, each having an arc-shaped top plan view. Each of the segment members 248 is movable radially, and as shown in FIG. 5, the segment member is moved toward a radially inward direction to be in contact with the wafer W and the retaining table 110, and on the other hand, as shown in FIG. 6, the segment member is moved toward a radially outward direction to define the flowing passage 150. In the present embodiment, respective adjacent segment members 248 are disposed along the circumference direction to be separated.

As shown in FIG. 5 and FIG. 6, each of the segment members 248 includes: a passage defining portion 242 defining a wall of the flowing passage 150 and extending in vertical direction; and a flange portion 244 extending from the upper end of the passage defining portion 242 in obliquely upward direction inclining toward a radially inward direction. Further, each of the segment members 248 includes a support 246 having a predetermined width dimension and extending from a bottom end of the passage defining portion 242 to the radially outer circumference thereof. As shown in FIG. 4, the support 246 is connected to a transfer mechanism 260 located outside of the cup member 130 via an inserting aperture formed in the cup member 130.

Each of the transfer mechanisms 260 is connected to a controller unit 270, so that each of the segment members 248 would be moved at a predetermined timing in the cleaning process. More specifically, the cleaning apparatus 200 comprises a gating unit for opening and closing the flowing passage 150, and the gating unit opens and closes the flowing passage 150 by moving the guard member 240 along a radial direction. More specifically, the controller unit 270 provides instructions to the respective segment members 248 so as to be in contact with the wafer W and the retaining table 110 before commencing the cleaning for the wafer W, so that the condition of closing the flowing passage 150 is provided, while a cleaning solution is supplied to the top surface of the wafer W (see FIG. 5). Once the cleaning of the wafer is commenced, respective segment members 248 are moved toward the radially outer circumferences to open the flowing passage 150, while maintaining the condition that the cleaning solution covers the top surface of the wafer W, and the retaining table 110 is rotated (see FIG. 6). This procedure provides a condition that the flowing passage 150 is fulfilled with the cleaning solution at the initial stage of the cleaning process, providing further improved cleaning efficiency.

Further, according to the apparatus 200 for cleaning the wafer W of the present embodiment, a cleaning solution can be flowed in vicinity of the side edge of the wafer W under the condition that a sufficient flow velocity is ensured, such that dusts on the side edge of the wafer W can be precisely removed.

Therefore, an improved production yield of wafer W can be provided, thereby reducing a manufacturing cost for the semiconductor device.

As described above, the guard member 240 may have a geometry of having a lacked portion along the circumference direction, and the point is that it is sufficient that the wafer W with the retaining table 110 and the guard member 240 define the flowing passage 150, which is capable of being fulfilled with a cleaning solution.

The method for cleaning the semiconductor wafer according to the present embodiment comprises: charging the cleaning solution by closing the flowing passage 150 while stopping the rotation of the retaining table 110 and supplying the cleaning solution to the top surface of the wafer W, before the operation of flowing the cleaning solution in the cleaning method of first embodiment, and wherein, in the aforementioned operation for flowing the cleaning solution, the flowing passage 150 is opened, and the cleaning solution is supplied to the top surface of the wafer W while rotating the retaining table 110.

While the configuration of moving the guard member 240 to open and close the flowing passage 150 has been illustrated in second embodiment, alternative configurations for opening and closing the flowing passage 150 by, for example, disposing other member in the flowing passage 150 while the guard member 240 is fixed, may be employed, and thus the configuration of the gating unit may be appropriately selected.

Further, while the configuration of the guard members 140 and 240 that include flange portions 144 and 244, respectively, has been illustrated in first and second embodiments, an alternative configuration may have no flange portion 144 or 244. Further, while the configuration of the passage defining portion 142 and 242 extending from the above of the wafer W to the vicinity of the bottom end of the retaining table 110 in the side view has been illustrated, an alternative configuration of the passage defining portion 142 and 242 at least overlapping with the side edge of wafer W in the side view may provide a sufficient cleaning effect for the side edge of the wafer W. In other words, it may be sufficient to form the passage defining portion 142 and 242, in which the upper end thereof is higher than the upper end of the wafer W, and the bottom end is lower than the bottom end of the wafer W.

Further, an alternative configuration of drawing the cleaning solution in the flowing passage 150 from the lower portion thereof with a pump or the like may be employed. Further, a manner for supplying the cleaning solution and/or a geometry of the cup member 130 may be suitably selected, and it is needless to note that other specific detailed structure may also be suitably changed and selected.

It is apparent that the present invention is not limited to the above embodiment, and may be modified and changed without departing from the scope and spirit of the invention.

What is claimed is:

1. An apparatus for cleaning a semiconductor wafer, comprising:
    a retaining table having a circular top plan view, said retaining table being capable of retaining a wafer disposed on the top surface thereof and being capable of rotating during cleaning the wafer;
    a supply unit for supplying a cleaning solution to the top surface of said wafer disposed on said retaining table;
    a cup member for recovering said cleaning solution supplied to said wafer by said supply unit, said cup member surrounding a radially outer circumference and a bottom of said retaining table;
    a guard member, being disposed in an inside of said cup member and being spaced apart from said retaining table, said guard member surrounding the radially outer circumference of said retaining table, and
    a gating unit, which provides opening and closing of said flowing passage;
    wherein said retaining table retains the wafer so that the side edge of the retaining table and the side edge of the wafer form a common surface,
    wherein the side edges of said wafer and said retaining table and an inner surface of said guard member define a flowing passage, which is capable of being substantially fulfilled with said cleaning solution during the cleaning of the wafer; and
    wherein said gating unit provides opening and closing of said flowing passage by moving said guard member toward a radial direction.

2. The apparatus for cleaning the semiconductor wafer according to claim 1, wherein a distance between the side edges of said wafer and said retaining table and the inner surface of said guard member is within a range of from 3 mm to 10 mm.

3. The apparatus for cleaning the semiconductor wafer according to claim 1, wherein the apparatus is configured that, before commencing the cleaning of said wafer, said cleaning solution is supplied to the top surface of said wafer by said supply unit while said flowing passage is closed, and once the cleaning of said wafer is commenced, said flowing passage is opened.

4. The apparatus for cleaning the semiconductor wafer according to claim 1, wherein said guard member includes: a passage defining portion defining a wall of said flowing passage and extending in vertical direction; and a flange portion extending from the upper end of said passage defining portion in obliquely upward direction inclining toward a radially inward direction.

5. A method for cleaning a semiconductor wafer, by employing an apparatus for cleaning a semiconductor wafer, said apparatus comprising:
    a retaining table having a circular top plan view, said retaining table being capable of retaining a wafer disposed on the top surface thereof and being capable of rotating during cleaning the wafer;
    a supply unit for supplying a cleaning solution to the top surface of said wafer disposed on said retaining table;
    a cup member for recovering said cleaning solution supplied to said wafer by said supply unit, said cup member surrounding a radially outer circumference and a bottom of said retaining table;
    a guard member, being disposed in an inside of said cup member and being spaced apart from said retaining table, said guard member surrounding the radially outer circumference of said retaining table, and
    a gating unit, which provides opening and closing of said flowing passage;
    wherein said gating unit provides opening and closing of said flowing passage by moving said guard member toward a radial direction, said method comprising:
    defining a flowing passage with the side edges of said wafer and said retaining table and an inner surface of said guard member, while retaining said wafer so that the side edge of the retaining table and the side edge of the wafer form a common surface; and flowing a cleaning solution by supplying said cleaning solution to a top surface of said wafer while rotating said retaining table together with the wafer, thereby flowing into the flowing passage said cleaning solution, which moves in the top surface of said wafer toward the radially outer circumference, so that said flowing passage is substantially filled with said cleaning solution.

6. The method for cleaning the semiconductor wafer according to claim 5, further comprising: charging the cleaning solution by closing said flowing passage while stopping the rotation of said retaining table and supplying said cleaning solution to the top surface of said wafer, before said flowing the cleaning solution, wherein, in said flowing the cleaning solution, said flowing passage is opened, and said cleaning solution is supplied to the top surface of said wafer while rotating said retaining table.

* * * * *